United States Patent [19]

Dischert

[11] Patent Number: 4,769,691
[45] Date of Patent: Sep. 6, 1988

[54] BURST LOCKED OSCILLATOR WITH SIDE-LOCK PROTECTION

[75] Inventor: Robert A. Dischert, Burlington Township, Burlington County, N.J.

[73] Assignee: RCA Licensing Corporation, Princeton, N.J.

[21] Appl. No.: 20,984

[22] Filed: Mar. 2, 1987

[51] Int. Cl.⁴ .................................................. H04N 9/45
[52] U.S. Cl. ........................................ 358/19; 358/25
[58] Field of Search .............................. 358/19, 23, 25

[56] References Cited

U.S. PATENT DOCUMENTS

| | | | |
|---|---|---|---|
| 3,532,819 | 10/1970 | Lipoma et al. | 358/158 |
| 3,578,902 | 5/1971 | Monsay | 358/323 |
| 4,255,759 | 3/1981 | Ohmori et al. | 358/19 |
| 4,405,937 | 9/1983 | Kudo | 358/40 |
| 4,456,884 | 6/1984 | Yarborough, Jr. | 329/50 |
| 4,500,909 | 2/1985 | Machida | 358/17 |
| 4,544,943 | 10/1985 | Quan | 358/25 |
| 4,561,014 | 12/1985 | Douziech et al. | 358/25 |
| 4,617,520 | 10/1986 | Levine | 328/133 |

OTHER PUBLICATIONS

"RCA Databook, CMOS Microprocessors, Memories and Peripherals", RCA Corporation, 10/84, pp. 706–711.

Primary Examiner—John W. Shepperd
Attorney, Agent, or Firm—Paul J. Rasmussen; Eric P. Herrmann; Kenneth N. Nigon

[57] ABSTRACT

A burst locked phase locked loop (PLL) includes a relatively wide-band voltage controlled oscillator. This PLL may erroneously lock at a frequency which differs form the frequency of burst by an amount equal to the horizontal line frequency. To prevent this side-locking condition, the PLL includes circuitry which changes the frequency of the signal produced by the VCO when the number of cycles of the signal provided by the PLL during one horizontal line interval corresponds to the number which would be obtained in a side-lock condition.

6 Claims, 1 Drawing Sheet

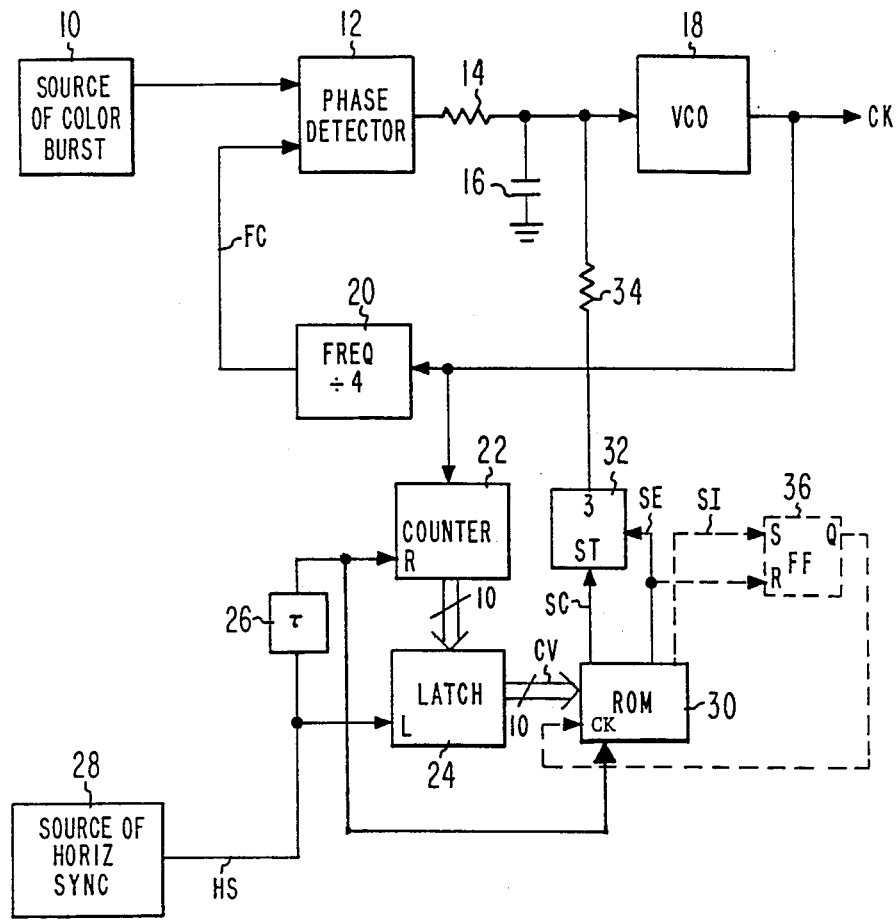

BURST LOCKED OSCILLATOR WITH SIDE-LOCK PROTECTION

The invention described herein was made in performance of work under NASA Contract No. NAS 9-15374 and is subject to the provisions of section 305 of the National Aeronautics and Space Act of 1958 (72 Stat. 435; 42 U.S.C. 2457).

This invention relates to a phase-locked loop system which generates a signal that is locked in frequency and phase to the color synchronizing burst signal component of a composite video signal and which is prevented from locking at an erroneous frequency.

Color television signals under the PAL and NTSC signal standards include color information signals which are phase modulated onto a suppressed color subcarrier signal having a frequency within the band of frequencies occupied by the baseband luminance signals. In a conventional PAL or NTSC television receiver, the modulated subcarrier signal is separated from the luminance signals and then synchronously demodulated to recover the color information signals. As a step in the synchronous demodulation process, it is desirable to regenerate the suppressed color subcarrier signal. This is generally done by a phase-locked-loop (PLL) which generates a continuous oscillatory signal that is locked in frequency and phase to the color synchronizing burst signal component of the composite video signal. The burst signal component includes eight to ten cycles of a signal having the same frequency as the suppressed subcarrier signal. This burst signal occupies a small portion, the burst interval, of each horizontal line of the video signal.

One potential problem which exists in these PLL systems is side-locking. Side-locking occurs when the PLL erroneously locks at a frequency which differs from the frequency, $f_c$, of the color subcarrier signal by an amount equal to the frequency, $f_H$, of the horizontal line scanning signal. Side-locking occurs because the PLL uses only a relatively small portion of each horizontal line to regenerate the subcarrier signal.

One method of guarding against side-lock conditions is to use a resonant crystal oscillator in the PLL. Using this type of oscillator, the range of frequencies which may be produced by the PLL is restricted to exclude any of the side-locked frequencies. This method is undesirable, however, since the resonant crystal is relatively expensive and since resonant crystal oscillators generally need to be trimmed manually, a relatively expensive step in the assembly of a consumer television receiver or video tape recorder.

One method which does not require a resonant crystal and which does not need a manual trimming operation is set forth in U.S. Pat. No. 4,255,759, which is hereby incorporated by reference. In this system, coarse frequency control circuitry is used to hold the signal produced by automatic phase control circuitry (a PLL) within a range that excludes the side-lock frequencies. This system is in effect a double PLL. An inner PLL, the automatic phase control circuitry, locks to the color reference burst signal component of the composite video signal while an outer PLL, the coarse frequency control circuitry, locks to the horizontal line synchronization signal components of the composite video signal. This system depends on the ratio of $f_c$ to $f_H$ remaining constant. In the NTSC system, for example, the color subcarrier signal is the 455th harmonic of one-half the line scanning frequency (i.e. $f_c = 227.5\ f_H$). For broadcast and other "standard" signals this ratio holds. However, for signals produced by "nonstandard" sources such as video tape recorders, video disc players and home computers the ratio of $f_c$ to $f_H$ may vary over a range of values centered about the nominal value. Only a relatively small portion of this range of values corresponds to undesirable side-lock conditions. The system set forth in the referenced patent may not perform well when these nonstandard sources are used because the combined effect of the two loops may change the frequency of the regenerated subcarrier signal when no change is desired.

SUMMARY OF THE INVENTION

The present invention is embodied in circuitry which includes a wide-band phase-locked loop that is synchronized to the color synchronizing burst signal component of a composite video signal. The signal produced by this phase-locked loop is applied to circuitry which is responsive to the horizontal line synchronizing signal component of the composite video signal for detecting a side-lock condition. When a potential side-lock condition is detected, this circuitry applies a signal to the phase-locked loop to correct the side-lock condition. When no potential a side-lock condition is detected, this circuitry has no effect on the operation of the phase locked loop.

BRIEF DESCRIPTION OF THE DRAWING

The sole FIGURE is a block diagram, partially in schematic diagram form, of a phase locked loop system embodying the present invention.

DETAILED DESCRIPTION

In the drawing, broad arrows represent busses for conveying multiple-bit parallel digital signals and line arrows represent connections for conveying analog signals or single-bit digital signals. Depending on the processing speed of the devices, compensating delays may be required in certain of the signal paths. One skilled in the art of designing phase locked loop systems would know where such delays would be needed in a particular system.

In the PLL system shown in the figure, a source of color burst signal 10, which may, for example, include the tuner, IF amplifier, video detector, and burst gate circuitry of a conventional television receiver provides separated color burst signals to one input terminal of a phase detector 12. The phase detector 12, which may be of conventional design, compares the color burst signal to an oscillatory signal, FC, produced by a frequency divider 20. The signal FC has substantially the same frequency as the color burst signal. The output signals provided by the phase detector 12 are proportional to the difference in phase between the burst signal and the signal provided by the frequency divider 20. The output signal of the phase detector 12 is applied to a low-pass filter, the system loop filter of the PLL, which includes a resistor 14 and a capacitor 16. This low-pass filter integrates the phase error signal over several horizontal line intervals to develop a frequency control signal which is applied to the input terminal of a voltage controlled oscillator (VCO) 18. The VCO 18 may be, for example, a relatively inexpensive, wide-band circuit which includes a resistor-capacitor (RC) resonant circuit. The free-running frequency of this VCO is approximately $4f_c$, four times the frequency $f_c$ of the color subcarrier signal. The output signal provided by the VCO 18 is a signal, CK, which may be used in a television receiver as shown, for example, in the referenced U.S. Pat. No. 4,255,759. The signal CK is applied to the frequency divider 20 which divides its frequency, by four to produce the signal FC that is applied at the phase detector 12.

The circuit described above is a conventional burst-locked PLL. However, as set forth above, because this PLL uses a relatively wide-band VCO, it may be susceptible to side-locking. Side-locking occurs when the frequency of the signal FC differs from $f_c$ by an amount substantially equal to $f_H$ or a multiple of $f_H$. Since the burst signal is applied to the phase detector 12 only during the burst interval of each horizontal line, the output signal provided by the phase detector 12 exhibits local minima when the frequency of FC is substantially equal to $f_c-f_H$, $f_c$, and $f_c+f_H$. These three frequencies represent stable operating points for the PLL.

To prevent the PLL from stabilizing at one of the side-lock frequencies $f_c-f_H$ or $f_c+f_H$, the remainder of the circuitry in the figure detects a side-lock condition, and upon detection, destabilizes the PLL in a sense which causes the PLL to re-lock at a frequency substantially equal to $f_c$.

The $4f_c$ signal CK provided by the VCO 18 is one of the input signals to the detecting circuitry. This signal is applied to the input terminal of a ten-bit counter 22. A horizontal synchronization signal, HS, provided by a source of horizontal sync signals 28 is applied to a second input terminal of the detecting circuitry. The signal HS is applied, via the delay element 26, to the reset input terminal of the counter 22. The counter 22 increments its value for each pulse of the cignal CK. When standard signals are received and the PLL is not side-locked, the value produced by the counter 22 is reset to zero by a pulse of the signal HS, increments to 909, and is then reset to zero by the next subsequent pulse of the signal HS.

The ten-bit output value produced by the counter 22 is applied to a latch 24, which is controlled by the undelayed signal HS, to load the counter value during each horizontal line interval. The delay element 26 provides a delay that is a fraction of a period of the signal CK. Consequently, the value loaded into the latch 24 is substantially equal to the value produced by the counter 22 immediately before it is reset.

The value stored into latch 24 is applied to the address input port of a read only memory (ROM) 30. The ROM 30 includes an address latch (not shown) which is clocked by the delayed horizontal synchronizing signal provided by the delay element 26. The ROM 30 is programmed to produce output signals SC, SE and, in an alternative embodiment, an output signal SI, responsive to different values applied to its address input port. The following Table I illustrates the values of the signals SC and SE that are produced responsive to the different values of the count value signal CV. In the table, a value of 'x' indicates a "don't care" state.

TABLE I

| CV | SC | SE |
|---|---|---|
| ≦905 | 1 | 0 |
| 906–912 | x | 1 |
| ≧913 | 0 | 0 |

The signals SC and SE are applied to the signal input terminal and control input terminal, respectively, of a three-state gate 32. The gate 32 provides an output signal which is applied, through a resistor 34, to the interconnection of the resistor 14 and capacitor 16. The signal SE is an error signal, indicating that the PLL may be in a side-lock condition. The signal SC indicates the type of side-lock, either greater than or less than the desired frequency. When the signal SE is a logic zero, the three-state gate 32 is enabled to apply a signal to the resistor 34 which is substantially equal to the signal SC. However, when the signal SE is a logic one, the three-state gate 32 exhibits a high impedance at its output terminal effectively removing the side-lock protection circuit from the PLL. In this embodiment of the invention, the signal SE conditions the gate 32 to exhibit a high impedance state for count values ranging from 906 to 912. Count values in this range correspond to variations in the ratio of $f_c$ to $f_H$ which do not correspond to a side-lock condition. These variations may occur, for example, when the video signals applied to the PLL system are from a VTR, video disc player or home computer.

Count values less than or equal to 905 may indicate that the PLL has locked at a frequency $f_c-f_H$. In this instance, the ROM 30, via the signals SC and SE, conditions the gate 32 to apply a logic one to the resistor 34 to cause the VCO 18 to increase the frequency of its output signal. The amount by which the frequency is increased is sufficient to destabilize the PLL and cause it to relock at a frequency of $f_c$.

Conversely, count values greater than or equal to 913 may indicate that the PLL has locked at a frequency $f_c+f_H$. In this instance, the signals provided by the ROM 30 condition the gate 32 to apply a logic zero value to the resistor 34. This causes the VCO 18 to decrease the frequency of its output signal by an amount sufficient to condition the PLL to lock at $f_c$.

The flip-flop 36, shown in phantom, is included in an alternative embodiment of the invention to compensate for errors in the input video signal which may, for example, cause one horizontal sync pulse to be missing, or which may result in a sudden phase shift in the horizontal synchronization signal without any change in the ratio of $f_c$ to $f_H$. The first of these errors may be caused by a defect in the tape of a VTR which prevents one pulse of the horizontal synchronization signal from being recorded. The second error may occur during head switching in a multiple-head VTR when the video signal is obtained from at least two of the heads.

Each of these errors results in a change in the ratio of $f_c$ to $f_H$ during one horizontal line interval which does not occur during subsequent line intervals. The flip-flop 36 is included in the PLL system to ignore single errors of this type. The flip-flop 36 may be, for example, a conventional set-reset flip-flop.

In the illustrative embodiment, the flip-flop 36 is of the type wherein the set input takes precedence if a value of logic one is applied to both the set and reset input terminals. A signal, SI, provided by the ROM 30 is applied to the set input terminal, S, of the flip-flop 36 and the signal SE is applied to the reset input terminal, R. The output terminal Q is coupled to the address input port of the ROM 30 as, for example, the least significant bit of the address value. Table 2 illustrates the operation of the ROM 30 and flip-flop 36. Since the output signal, Q, of the flip-flop 36 is changed by the ROM 30 and since the signal Q is an address input signal to the ROM 30, separate from the signal CV, it is listed both as an input ($Q_i$) and an output ($Q_{i+1}$) in the Table II.

TABLE II

| CV | $Q_i$ | SC | SE | SI | $Q_{i+1}$ |
|---|---|---|---|---|---|
| ≦905 | 0 | x | 1 | 1 | 1 |
| ≦905 | 1 | 1 | 0 | 1 | 1 |
| 906–912 | 0 | x | 1 | 0 | 0 |
| 906–912 | 1 | x | 1 | 0 | 0 |
| ≧913 | 0 | x | 1 | 1 | 1 |
| ≧913 | 1 | 0 | 0 | 1 | 1 |

As illustrated by Table II, if the flip-flop 36 is reset when a possible side-lock condition is detected, the flip-flop 36 is set but the signals SC and SE are not changed. A side-lock indication during the next successive line interval activates the side-lock protection circuitry to correct the condition. However, if the flip-flop 36 is set during one horizontal line interval and the output of the ROM 30 during the next horizontal line interval does not indicate a possible side-lock condition the flip-flop 36 is reset.

What is claimed is:

1. In a system for processing television signals which include a color synchronizing burst signal component and a periodic horizontal line synchronizing signal component, a phase locked loop system comprising:

a source of said color synchronizing burst signal;

a source of said periodic horizontal line synchronizing signal;

phase locked loop circuitry, coupled to said source of color synchronizing burst signal, for providing an oscillatory signal that is substantially locked in phase to said color synchronizing burst signal, said phase locked loop circuitry being susceptible to undesirable side-lock conditions;

detecting means, coupled to said phase locked loop circuitry for generating, during each period of said horizontal line synchronizing signal, an error signal which is in a first state when said oscillatory signal indicates that said phase locked loop circuitry may be in said side-lock condition and which is in a second state otherwise; and correcting means, coupled to said detecting means and responsive to said error signal being in said first state for changing the frequency of the signal produced by said phase locked loop in a sense to correct said side-lock condition, said correcting means having no substantial effect on the frequency of the signal produced by said phase locked loop circuitry when said error signal is in said second state.

2. The phase locked loop system set forth in claim 1 wherein:

said phase locked loop circuitry is susceptible to first and second side-lock conditions for which the frequency of said oscillatory signal is respectively greater than and less than a desired frequency;

said detecting means further includes circuitry for providing, during each period of said horizontal line synchronizing signal, an error type signal which is in first and second states when said oscillatory signal indicates that said phase locked loop circuitry may be in said first and second side-lock conditions, respectively; and said correcting means is responsive to said error signal and to said error type signal for generating a correction potential for application to said phase locked loop circuitry, said correction potential having first and second polarities with respect to a reference value when said error signal and said error type signal indicate said first and second side-lock conditions, respectively, and having a null value when said error signal does not indicate a side-lock condition.

3. The phase locked loop system set forth in claim 2 wherein:

said phase locked loop circuitry includes:

phase detecting means, responsive to said oscillatory signal and to the color synchronizing burst signal provided by said source, for generating a phase difference signal that is proportional to the instantaneous difference in phase therebetween;

integrating means, coupled to said phase detecting means for integrating the phase difference signal to produce a frequency control signal; and a variable oscillator coupled to said integrating means for producing said oscillatory signal, the frequency of said oscillatory signal being determined by said frequency control signal; and said correcting means includes means for applying said correction potential to said integrating means.

4. The phase locked loop system set forth in claim 3 wherein said detecting means includes:

counting means, coupled to said phase locked loop circuitry for generating a signal substantially equal to the number of periods of said oscillatory signal occurring in each period of said horizontal line synchronizing signal; and means, coupled to said counting means and responsive to the signal provided thereby, for generating said error signal in said first and second states when the signal provided by said counting means has values that are respectively outside of or within a predetermined range of values, and for generating said error type signal in said first and second states when the signal provided by said counting means has values that are respectively greater than and less than the values in said predetermined range of values.

5. A phase locked loop system for use in a television signal processing system, comprising:

a source of horizontal line synchronizing signal having a first predetermined frequency;

a source of color synchronizing burst signal having a second predetermined frequency and a predetermined phase, wherein said second predetermined frequency is the Nth harmonic of one-half of said first predetermined frequency, where N is an odd integer;

phase locked loop circuitry, coupled to said source of color synchronizing burst signal for generating an oscillatory signal having a frequency substantially equal to M times the frequency of said color synchronizing burst signal, and being substantially locked in phase to said color synchronizing burst signal, where M is an even integer, said phase locked loop circuitry being subject to undesirable side-lock conditions wherein the frequency of said oscillatory signal differs from a frequency (M*N/2) times the frequency of said horizontal line synchronizing signal, by an amount not less than the frequency of said horizontal line synchronizing signal;

counting means, coupled to said phase locked loop circuitry for generating a signal having values substantially equal to the number of periods of said oscillatory signal occurring during each period of said horizontal line synchronizing signal;

detecting means, coupled to said counting means and responsive to the signal provided thereby for generating, during each period of said horizontal line synchronizing signal, a control signal which is in a first state when the value provided by said counting means has a value indicating that said phase locked loop circuitry is in one of said side-lock conditions, and is in a second state otherwise; and means, coupled to said detecting means and to said phase locked loop circuitry and responsive to said control signal being in said second state for changing the frequency of said oscillatory signal.

6. In a system for processing television signals which includes a color synchronizing burst signal component and a periodic horizontal line synchronizing signal component, a phase locked loop system comprising:

a source of said color synchronizing burst signal;

a source of said periodic horizontal line synchronizing signal;

phase locked loop circuitry, coupled to said source of color synchronizing burst signal, for providing an oscillatory signal that is substantially locked in phase to said color synchronizing burst signal, said phase locked loop circuitry being susceptible to undesirable first and second side-lock conditions for which the frequency of said oscillatory signal is respectively greater than and less than a desired frequency;

detecting means, coupled to said phase locked loop circuitry including:

counting means for generating a signal having instantaneous values substantially equal to the number of periods of said oscillatory signal occurring in each period of said horizontal line synchronizing signal; and means, coupled to said counting means and responsive to the signal provided thereby for generating an error signal which is in a first state when the signal provided by said counting means has values that are outside of a predetermined range of values for at least two consecutive periods of said horizontal line synchronizing signal and in a second state otherwise, and for generating an error-type signal which is in first and second states when the signal provided by said counting means has values that are respectively greater than and less than the values in said predetermined range of values; and correcting means, coupled to said detecting means and responsive to said error signal being in said first state for applying said error type signal to said phase locked loop circuitry to condition said phase locked loop circuitry to change the frequency of said oscillatory signal in a sense to correct said first and second side-lock conditions, respectively and responsive to said error signal being in said second state for applying a null value to said phase locked loop circuitry, said null value having no substantial effect on the frequency of said oscillatory signal.

* * * * *